(12) United States Patent
Keränen et al.

(10) Patent No.: US 9,915,556 B2
(45) Date of Patent: *Mar. 13, 2018

(54) ILLUMINATED INDICATOR STRUCTURES FOR ELECTRONIC DEVICES

(71) Applicant: TactoTek Oy, Kempele (FI)

(72) Inventors: Antti Keränen, Oulu (FI); Mikko Heikkinen, Oulu (FI)

(73) Assignee: TactoTek Oy, Oulunsalo (FI)

( * ) Notice: Subject to any disclaimer, the term of this patent is extended or adjusted under 35 U.S.C. 154(b) by 0 days.

This patent is subject to a terminal disclaimer.

(21) Appl. No.: 15/082,059

(22) Filed: Mar. 28, 2016

(65) Prior Publication Data

US 2016/0209251 A1 Jul. 21, 2016

Related U.S. Application Data

(63) Continuation of application No. 14/046,425, filed on Oct. 4, 2013, now Pat. No. 9,297,675.

(51) Int. Cl.
*G01D 11/28* (2006.01)
*F21V 23/04* (2006.01)
(Continued)

(52) U.S. Cl.
CPC ............... *G01D 11/28* (2013.01); *F21K 9/60* (2016.08); *F21V 23/04* (2013.01); *H01H 13/83* (2013.01);
(Continued)

(58) Field of Classification Search
CPC .. G01D 11/28; H01H 13/83; H01H 2219/028; F21V 23/04; F21K 9/60
See application file for complete search history.

(56) References Cited

U.S. PATENT DOCUMENTS

| 5,504,661 A | 4/1996 | Szpak |
| 5,703,568 A | 12/1997 | Hegyi |

(Continued)

FOREIGN PATENT DOCUMENTS

| CN | 202514178 U | 10/2012 |
| CN | 105850230 A | 8/2016 |

(Continued)

OTHER PUBLICATIONS

"U.S. Appl. No. 14/046,425, Non-Final Office Action dated Mar. 2, 2015", 15 pgs.

(Continued)

*Primary Examiner* — Elmito Breval
(74) *Attorney, Agent, or Firm* — Schwegman Lundberg & Woessner, P.A.

(57) ABSTRACT

A composite laminate assembly for an electronic device provides integrated backlighting for one or more indicator shapes defined by the assembly. The assembly includes a substantially opaque cover member to obscure at least parts of the electronic device. Translucent indicator structures in the cover member define respective indicator shapes to allow backlighting to pass through the cover member. An optical matrix layer of an optically conductive material is attached to an inner face of the cover member, with a plurality of lighting devices embedded in the optical matrix layer and laterally offset from associated indicator structures. The plurality of lighting devices may be connected to an electric circuit carried on the inner face of the cover member.

20 Claims, 7 Drawing Sheets

(51) Int. Cl.
*F21K 9/60* (2016.01)
*H01H 13/83* (2006.01)

(52) U.S. Cl.
CPC . *H01H 2219/028* (2013.01); *H01H 2219/039* (2013.01); *H01H 2219/056* (2013.01); *H01H 2219/06* (2013.01)

(56) References Cited

U.S. PATENT DOCUMENTS

| | | | |
|---|---|---|---|
| 6,299,338 | B1 | 10/2001 | Monty et al. |
| 6,520,654 | B2 | 2/2003 | Angell et al. |
| 6,605,483 | B2 | 8/2003 | Victor et al. |
| 6,811,278 | B2 | 11/2004 | Sung |
| 6,969,189 | B2 | 11/2005 | Lee et al. |
| 7,717,569 | B2 | 5/2010 | Sokeila et al. |
| 7,748,148 | B2 | 7/2010 | Reiland et al. |
| 7,997,771 | B2 | 8/2011 | Epstein et al. |
| 8,465,175 | B2 | 6/2013 | Nall et al. |
| 8,514,545 | B2 | 8/2013 | Haag |
| 9,297,675 | B2 | 3/2016 | Keränen et al. |
| 2002/0131261 | A1 | 9/2002 | Inui et al. |
| 2004/0004827 | A1 | 1/2004 | Guest |
| 2007/0115687 | A1 | 5/2007 | Verweg et al. |
| 2007/0152983 | A1 | 7/2007 | Mckillop et al. |
| 2007/0201239 | A1 | 8/2007 | Rosario et al. |
| 2008/0062711 | A1 | 3/2008 | Veenstra et al. |
| 2010/0026632 | A1 | 2/2010 | Ishida et al. |
| 2011/0013381 | A1 | 1/2011 | Boulais |
| 2015/0098205 | A1 | 4/2015 | Keränen et al. |

FOREIGN PATENT DOCUMENTS

| | | | |
|---|---|---|---|
| EP | 0667976 | B1 | 12/1997 |
| EP | 2079006 | A1 | 7/2009 |
| EP | 2596991 | A1 | 5/2013 |
| IN | 201617015285 | A | 8/2016 |
| JP | 2017500752 | A | 1/2017 |
| KR | 20080024707 | A | 3/2008 |
| KR | 1020160074527 | A | 6/2016 |
| TW | 201527717 | A | 7/2015 |
| TW | I551847 | B | 10/2016 |
| WO | WO-2009013026 | A1 | 1/2009 |
| WO | WO-2009075924 | A1 | 6/2009 |
| WO | WO-2015002665 | A1 | 1/2015 |
| WO | WO-2015049425 | A1 | 4/2015 |

OTHER PUBLICATIONS

"U.S. Appl. No. 14/046,425, Notice of Allowance dated Sep. 11, 2015", 8 pgs

"U.S. Appl. No. 14/046,425, Notice of Allowance dated Nov. 20, 2015", 7 pgs.

"U.S. Appl. No. 14/046,425, Response filed Aug. 3, 2015 to Non Final Office Action dated Mar. 2, 2015", 15 pgs.

"International Application Serial No. PCT/FI2014/050755, International Search Report dated Jan. 16, 2015", 4 pgs.

"International Application Serial No. PCT/FI2014/050755, Written Opinion dated Jan. 16, 2015", 9 pgs.

"Taiwanese Application Serial No. 103134662, Office Action dated Mar. 11, 2016", 4 pgs.

"Taiwanese Application Serial No. 103134662, Office Action dated Aug. 11, 2015", W/ English Translation, 7 pgs.

"Taiwanese Application Serial No. 103134662, Response filed Feb. 15, 2016 to Office Action dated Aug. 11, 2015", (English Translation of Claims), 38 pgs.

"Taiwanese Application Serial No. 103134662, Response filed Jun. 15, 2016 to Office Action dated Mar. 11, 2016", (English Translation of Claims), 34 pgs.

Xiaoli, Xiao, "Techinal Data Sheet: Chip LED with Right Angle Lens", Everlight Electronics Co.,LTD Part No. 27-21/BHC-AP1Q2/3C, (Sep. 20, 2008), 10 pgs.

"European Application Serial No. 14850669.4, Response filed Dec. 1, 2016 to Communication pursuant to Rules 161(2) and 162 EPC dated Jun. 1, 2016", 16 pgs.

"Light Guide Techniques—Using LED Lamps", Avago Technologies- Application Brief I-003, (Dec. 11, 2006), 22 pgs.

"European Application Serial No. 14850669.4, Extended European Search Report dated Jun. 22, 2017", 10 pgs.

ILLUMINATED INDICATOR STRUCTURES FOR ELECTRONIC DEVICES

TECHNICAL FIELD

This disclosure relates generally to electronic devices and more particularly to illuminated indicator structures for electronic devices, e.g. comprising illuminated cover structures, indicator panels and/or control panels for electronic devices. The disclosure further relates, e.g., to methods of manufacturing a cover assemblies for electronic devices, and to methods of operating electronic devices.

BACKGROUND

Cover assemblies for electronic devices, e.g. to provide indicator panels or control panels for the electronic devices often include integrated lighting devices, such as LEDs, to provide information of particular indicators forming part of the cover assembly. The control panels for electronic devices, for example, often require segregated interactive elimination of multiple indicators responsive to user control of the electronic device.

The provision of such integrated backlighting devices can, however, lead to increased bulkiness of the cover assembly, which is often undesired. Such electronic components included in the cover assembly can furthermore compromise robustness and durability of the electronic device.

BRIEF DESCRIPTION OF THE DRAWINGS

In the drawings, which are not necessarily drawn to scale, like numerals may describe similar components in different views. Like numerals having different letter suffixes may represent different instances of similar components. Some embodiments are illustrated by way of example, and not limitation, in the figures of the accompanying drawings in which.

DETAILED DESCRIPTION

Figure 1:
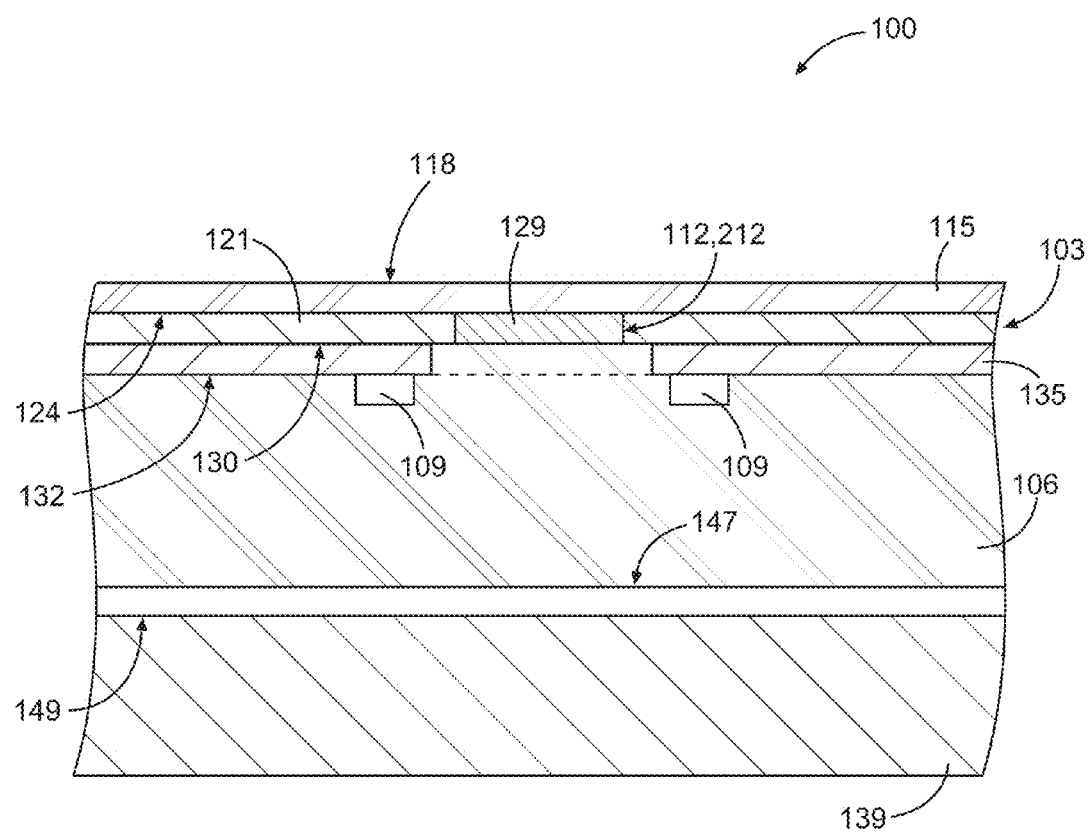
FIG. 1 is a schematic cross-sectional view of a part of an integrally illuminated control panel for an electronic device, in accordance with an example embodiment.

The following description and the drawings sufficiently illustrate specific embodiments to enable those skilled in the art to practice and/or implement the disclosed systems, methods, and/or apparatuses. Other embodiments may incorporate structural, operational, and other changes. Portions and features of some embodiments may be included in, or substituted for, those of other embodiments.

One aspect of the disclosure comprises an assembly for forming part of an electronic device, the assembly comprising:

a substantially opaque cover member configured for incorporation in the electronic device to obscure one or more other components of the electronic device from view, the cover member having an outer face and an opposite, inner face, with a thickness dimension of the cover member extending transversely between the outer face and the inner face;

one or more indicator structures in the cover member, each indicator structure having a periphery that defines a corresponding indicator shape in the cover member, each indicator structure being substantially translucent to allow passage of backlighting illumination across the thickness dimension of the cover member via the indicator structure;

an optical matrix layer attached to the inner face of the cover member and being coextensive with at least a part of the cover member that includes the one or more indicator structures, the optical matrix layer being of an optically conductive material; and a plurality of lighting devices embedded in the optical matrix layer and positioned such that two or more peripheral lighting devices are provided for each indicator structure, each peripheral lighting device being located at or adjacent the periphery of an associated indicator structure and being configured to provide backlighting illumination for the associated indicator structure, each peripheral lighting device being laterally offset from the periphery of the associated indicator structure, to be obscured by the cover member when the outer face of the cover member is viewed in a direction substantially parallel to the thickness dimension of the cover member at the respective indicator structure.

The indicator structures may be translucent, e.g., being provided at least in part by openings through the cover member. Being an optically conductive material, the optical matrix layer is at least translucent. In some embodiments, the optical matrix layer may be transparent. By transparent is meant a material having optical properties allowing light to pass through it such that objects behind it can be seen distinctly, but not necessarily such that the objects appear as if there is no intervening material. A foil or sheet that filters only some wavelengths of the optical spectrum, to colorize light passing through it, without significant diffusion, is also understood to be transparent.

The assembly may comprise a composite laminar structure, or laminate, that provides integrated backlighting for one or more indicator shapes, to serve as a cover panel for the electronic device. As such, the assembly may comprise an indicator panel, or in embodiments in which the assembly includes integrated control devices, such as capacitive buttons, the assembly may provide a control panel for an electronic device. Note that, as used herein, the term "panel" means a sheet-like cover element, but need not be flat, rectangular, or rigid. A control panel provided by the assembly may thus, for example, in some embodiments have a non-rectangular outline, may in some embodiments be non-rigid, e.g. being flexible, and may in some embodiments have a contoured, shaped outer surface. Note further that, as used herein, an "outer" side, surface, or orientation of the respective components means a side, surface, or orientation of the respective laminar component or laminate that will be further from a device covered by the laminate, when assembled, than is the case for an opposite, "inner" side, surface, or orientation.

The assembly may further comprise electronic circuitry embedded in the optical matrix layer and electronically coupled to the plurality of lighting devices. The electronic circuitry may comprise printed circuitry deposited on the inner face of the cover member, for example consisting of conductive traces printed on the inner face of the cover member. The plurality of lighting devices may be mounted on the inner face of the cover member.

The cover member may be a composite laminate comprising: a translucent substrate; and a substantially opaque masking layer carried by the translucent substrate, each indicator structure being defined by one or more corresponding openings in the masking layer. The masking layer may comprise printed material deposited on the inner face of the translucent substrate. The translucent substrate may be of a flexible polymeric plastics material, e.g. being of transparent polycarbonate.

The assembly may further comprise one or more control devices configured for manual user operation, the one or more control devices being embedded in the optical matrix layer and being coupled to the electronic circuitry. The control devices may comprise touch sensitive areas, e.g., capacitive buttons, to provide user control of the electronic device. The assembly may thus comprise one or more capacitive buttons mounted on the inner face of the cover member. In some embodiments, the one or more control devices may include at least one piezo-electric button mounted on the inner face of the cover member. Instead, or in addition, the assembly may further comprise one or more actuator devices configured for mechanical user feedback. The one or more actuator devices may be embedded in the optical matrix layer and coupled to the electronic circuitry. The one or more actuator devices may include at least one piezo-electric actuator mounted on the inner face of the cover member.

The optical matrix layer may be of a substantially transparent molded plastics material, e.g. comprising a layer of molded polycarbonate, polyurethane, or the like. The cover member may have a substantially constant thickness and may have a contoured shape, so that the inner and outer faces of the cover member are contoured, e.g. having a compound curvatures, or having a complex three-dimensional topography. The optical matrix layer may likewise be substantially constant in thickness, having a sympathetically contoured shape corresponding to that of the cover member. In some embodiments, a combined thickness of the cover member and the optical matrix layer may be less than 2 mm. The plurality of lighting devices may comprise a plurality of light emitting diodes (LEDs).

The assembly may further comprise a nonreflective surface at a major face of the optical matrix layer furthest from the cover member, so that the optical matrix layer is sandwiched between the cover member and the nonreflective surface. Provision of such a nonreflective surface limits an internal reflection of illumination provided by the lighting devices with in the optical matrix layer. The nonreflective surface may be interrupted by at least one optical effect area substantially coincident with a corresponding one of the one or more indicator structures in the cover member. The optical effect area may, for example, comprise a reflective area to promote reflection of illumination towards the corresponding indicator structure.

Another aspect of the disclosure comprises an assembly for forming part of an electronic device, the assembly comprising:

a substantially opaque cover member configured for incorporation in the electronic device to obscure one or more other components of the electronic device from view, the cover member having an outer face and an opposite, inner face, with a thickness dimension of the cover member extending transversely between the outer face and the inner face;

a plurality of indicator structures in the cover member, each indicator structure having a periphery that defines a corresponding indicator shape in the cover member, each indicator structure being substantially translucent to allow passage of backlighting illumination across the thickness dimension of the cover member via the indicator structure;

an optical matrix layer attached to the inner face of the cover member and being coextensive with at least a part of the cover member that includes the one or more indicator structures, the optical matrix layer being of an optically conductive material; and a plurality of lighting devices embedded in the optical matrix layer and positioned such that one or more peripheral lighting devices is provided for each indicator structure, each peripheral lighting device being located at or adjacent the periphery of an associated indicator structure and being configured to provide backlighting illumination for the associated indicator structure, each peripheral lighting device being laterally offset from the periphery of the associated indicator structure, to be obscured by the cover member when the outer face of the cover member is viewed in a direction substantially parallel to the thickness dimension of the cover member at the respective indicator structure.

A further aspect of the disclosure comprises an electronic device that includes an indicator panel assembly (which may in some instances provide a control panel assembly), as disclosed.

Yet a further aspect of the disclosure comprises a method of manufacturing a cover structure assembly for an electronic device, the method comprising:

providing a substantially opaque cover member configured for incorporation in the electronic device to obscure one or more other components of the electronic device from view, the cover member having an outer face and an opposite, inner face, with a thickness dimension of the cover member extending transversely between the outer face and the inner face, the cover member having one or more indicator structures therein, each indicator structure being substantially translucent to allow passage of backlighting illumination across the thickness dimension of the cover member via the indicator structure, and each indicator structure having a periphery that defines a corresponding indicator shape in the cover member;

positioning a plurality of lighting devices relative to the cover member such that two or more peripheral lighting devices are provided for each indicator structure, each peripheral lighting device being located at or adjacent the periphery of an associated indicator structure to provide backlighting illumination for the associated indicator structure, each peripheral lighting device being laterally offset from the periphery of the associated indicator structure, to be obscured by the cover member when the outer face of the cover member is viewed in a direction substantially parallel to the thickness dimension of the cover member at the respective indicator structure; and molding a translucent optical matrix layer on to the inner face of the cover member to embed the plurality of lighting devices in the optical matrix layer, the optical matrix layer being coextensive with at least a part of the cover member that includes the one or more indicator structures.

The method may further comprise providing electronic circuitry for the plurality of lighting devices, the positioning of the plurality of lighting devices comprising coupling the plurality of lighting devices to the electronic circuitry, and the molding of the optical matrix layer comprising embedding the plurality of lighting devices and the electronic circuitry in the optical matrix layer.

The providing of the electronic circuitry may comprise printing the electronic circuitry on the inner face of the cover member. The providing of the cover member may include forming a composite laminate structure comprising: a translucent substrate; and a substantially opaque masking layer carried by the translucent substrate, each indicator structure being defined by one or more corresponding openings in the masking layer.

The method may further comprise comprising coupling to the electronic circuitry one or more control devices configured for manual user-selection, the molding of the optical matrix layer comprising embedding the one or more control devices in the optical matrix layer.

Still a further aspect of the disclosure includes a method comprising backlighting one or more indicator shapes in an opaque cover member of an electronic device by activation of two or more peripheral lighting devices associated with each indicator shape, each indicator shape comprising a translucent area in the cover member and an associated periphery defined by the cover member, each peripheral lighting device being located at or adjacent the periphery of the associated indicator shape and being laterally offset from the periphery of the associated indicator shape such that it is obscured by the opaque cover member when an outer face of the cover member is viewed in a direction substantially parallel to a thickness dimension of the cover member, the two or more peripheral lighting device associated with the one or more indicator shapes being embedded in an optical matrix layer that is in contact with an inner face of the cover member and is coextensive with at least the one or more indicator shapes.

The method may further comprise providing an animated backlighting effect for at least one of the one or more indicator structures by automated time-varying activation and deactivation of the associated two or more peripheral lighting devices.

In FIG. 1 of the drawings, reference numeral 100 generally indicates a control panel assembly for an electronic device 200 (FIG. 2) according to an example embodiment. The control panel assembly 100 comprises a cover member 103 that is a composite laminate structure, with an optical matrix layer 106 connected to an inner side of the cover member 103. When incorporated in the device 200, the optical matrix layer 106 is thus located to a device-side of the cover member 103, the optical matrix layer 106 being sandwiched between the cover member 103 and a body 139 of the device 200.

Figure 7:
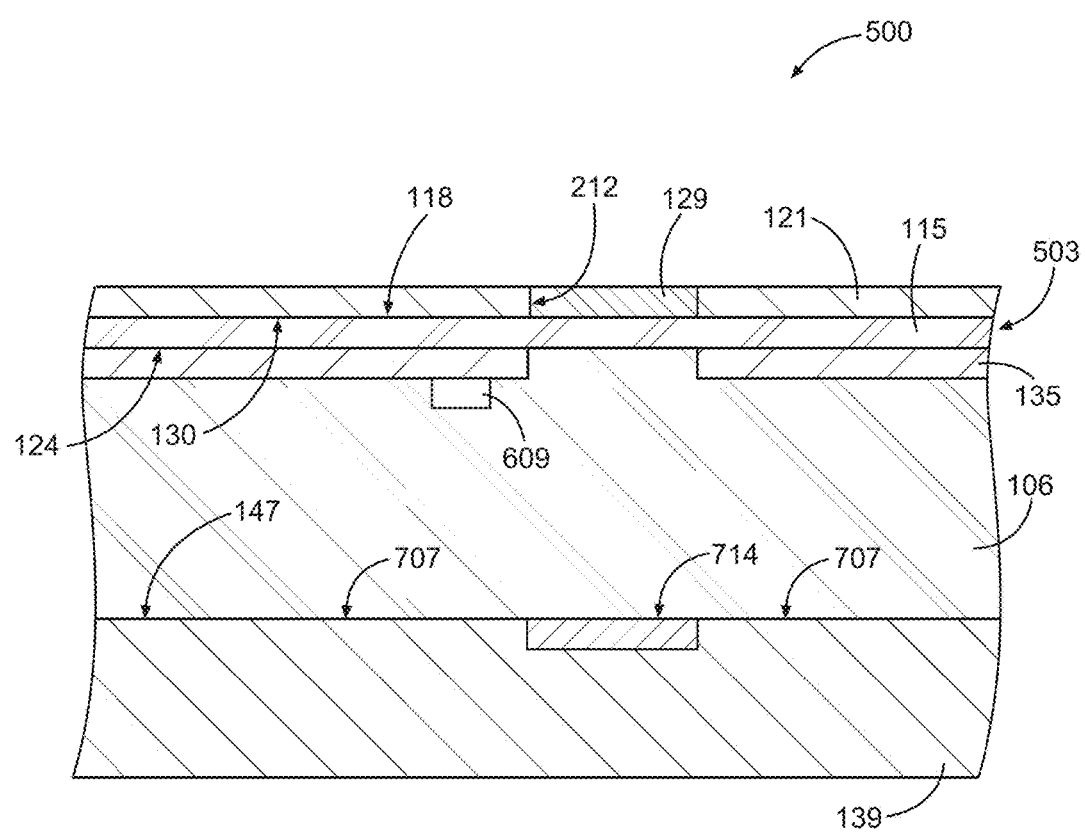
FIG. 7 is a schematic partial cross-sectional side view, to an enlarged scale, of a control panel assembly forming part of the electronic device of FIG. 5, in accordance with the further example embodiment.

The device has a backlighting illumination arrangement to backlight one or more indicator structures defined by the cover member 103 (see, e.g., central indicator window 112 in FIG. 2), as discussed at greater length below. The backlighting illumination arrangement in this embodiment comprises a plurality of lighting devices in the example form of light emitting diodes (LEDs) 109 that are, in this example, mounted on the cover member 103 and are embedded in the optical matrix layer 106. Each LED 109 is in this example an Everlight™ surface mounted device (SMD) LED with part no. 27-21/BHC-AP1Q2/3C. The example LEDs thus has a rectangular profile of about 1.7 mm by 0.6 mm, and has a height (e.g., oriented in the thickness dimension of the cover panel assembly 100 of about 1.1 mm). Note that FIGS. 1 and 7 are schematic views that are not necessarily drawn to scale. In the example embodiments, the height of the LEDs 109 may be 0.5 or more times a thickness of the optical matrix layer 106.

The matrix layer 106 comprises a molded layer of a translucent plastics polymeric material. In this example embodiment, the matrix layer 106 is substantially transparent, comprising clear, molded polycarbonate. Note, however, that different optically conductive materials can be used in other embodiments to provide the optical matrix layer 106. The optical matrix layer 106 thus provides not only for hermetically sealed encapsulation of the LEDs 109, but also serves as a light guide or optical medium for indicator illumination purposes. As will be described in greater detail below, the LEDs 109 are mounted on the inside of the cover member 103 and are laterally offset from the indicator window 112 defined by the cover member 103.

Being a laminated structure, the example cover member 103 has a pair of opposite major faces, with a thickness dimension of the cover member 103 extending transversely between the major faces. The cover member 103 thus has an outer face 118 to provide an exterior of the device 200, with an inner face 135 direct towards the body 139 of the device 200. The optical matrix layer 106 is bonded to the inner face 135 of the cover member 103.

The example cover member 103 comprises a translucent substrate in the form of a transparent membrane or substrate foil 115 that serves as a base structure for other components of the cover member 103 and a control panel laminate provided by the assembly 100. In the example of the FIG. 1, the substrate foil 115 is substantially transparent, being composed of a flexible, clear polymeric plastics material. In this example embodiment, the substrate foil 115 is a shaped sheet of clear polycarbonate. In the example embodiment of FIG. 1, the substrate foil 115 forms an outermost component of the laminar cover member 103, so that the outer face 118 of the cover member 103 is provided by an outer surface of the substrate foil 115. In other embodiments, one or more components of the cover member 103 may be attached or deposited on the outer face 118 of the substrate foil 115 (see, e.g. FIG. 7).

The cover member 103 further includes a substantially opaque screening element to cover parts of the device 200 from view. In this example embodiment, the screening element is in the form of an opaque masking layer 121. The example masking layer 121 is provided on an inner surface 124 of the substrate foil 115. The masking layer 121 is substantially opaque, thereby to obscure from view those parts of the device 200 coincident therewith and positioned to the inner side of the masking layer 121. In this example embodiment, the masking layer 121 comprises one or more layers of ink printed on the inner surface 124 of the substrate foil 115.

The above-mentioned indicator structure(s) is defined by the masking layer 121. In this example, the cover member 103 has a single indicator structure in the form of the central, circular indicator window 112 comprising a shaped opening in the masking layer 121. The indicator window 112 thus has a circular periphery 212 located more or less centrally in the masking layer 121. Shaped portions of the masking layer 121 within the indicator window 112 defines a trademark logo 208 silhouetted against the indicator window 112. In other embodiments, the cover member may define (e.g., by means of openings in an opaque screening element such as the masking layer 121) a number of indicator structures, for example comprising decorative and/or informative shapes, devices, symbols, indicia, or the like. The indicator structure(s) can be configured to indicate one or more operations of the electronic device 200 by backlighting illumination of the respective indicator structure(s). The assembly 100 and is thus configured to provide, at least, an indicator display panel for the device 200, and to provide an interactive, integrally illuminated control panel in instances (such as the example embodiment of FIGS. 1-4) where the assembly 100 also includes a control arrangement, as will be described in more detail below.

Referring again to FIG. 2, it can be seen that, in addition to indicator structures defined by openings in the masking layer 121, the masking layer 121 may comprise multi-color printing to define additional markings and/or indicia on the cover member 103. A majority of the masking layer 121 of the example device 200 is provided in black ink, with white ink printing proximate the substrate foil 115 providing markings in the example form of a device brand name 210 and an arcuate control identifier 213.

Because the ink of the masking layer 121 is deposited directly on the inner surface 124 of the transparent substrate foil 115, the decorative and/or informational components of the masking layer 121 is clearly visible from the outer side of the control panel assembly 100, having a smooth, protective outer surface provided by the substrate foil 115.

In other embodiments, an opaque screening element of the control panel assembly 100 may instead, or in combination, comprise one or more sheet-like elements or membranes attached to the substrate foil 115, for example comprising a perforated sheet of plastics material and/or decal(s) adhered to the substrate foil 115. Note that while the masking layer 121 is in this example embodiment provided on the inner surface 124 of the substrate foil 115, some or all of the masking layer 121 or a corresponding screening element may, in other embodiments, be carried on the outer face 118 of the substrate foil 115.

The optical matrix layer 106 is coextensive with the masking layer 121, so that the optical matrix layer 106 extends continuously beneath the entire masking layer 121, including the indicator window 112. In this example embodiment, the optical matrix layer 106 extends somewhat beyond an outer boundary of the masking layer 121, so that a peripheral ring 220 provided by the optical matrix layer 106 extends continuously around an outer boundary of the cover member 103. Referring again to FIG. 1, it is shown that a transparent optical element 129 forms part of the indicator window 112, being located in the opening in the masking layer 121 that defines the indicator window 112, and being attached to the inner surface 124 of the substrate foil 115. The optical element 129 in this embodiment comprises a transparent blue layer printed on the inner surface 124 of the substrate foil 115, to colorize backlighting illumination that passes through the indicator window 112 from the optical matrix layer 106.

The control panel assembly 100 further comprises electronic circuitry 132 carried by the cover member 103, in this example being connected to an inner surface 130 of the masking layer 121. The electronic circuitry 132 in this example embodiment comprises conductive traces 135 printed on the inner surface 130 of the masking layer 121, thereby effectively to form a printed circuit board (PCB), or part thereof, on an inner surface or underside of the cover member 103. The LEDs 109 are coupled to the conductive traces 135, to activation/deactivation of the LEDs 109 by controlling electronics in the device 200, via the conductive traces 135.

The printed electronic circuitry 132 may also provide, or may be coupled to, other electronic components in addition to the LEDs 109. The control panel assembly 100 may, for example, include a control arrangement comprising one or more control devices configured for manual user operation, e.g. to receive user input for control of the electronic device 200. In this example embodiment, the control device comprises a number of capacitive buttons 305 (see, e.g., FIG. 3) printed on the inner surface 130 of the masking layer 121. The combined thickness of the masking layer 121 and the substrate foil 115 is sufficiently small to allow capacitive proximity sensing of a user's finger when pressed against the outer face 118 of the cover member 103. In this example, two of the buttons 305 are in register with the control identifiers 213 visible from outside of the control panel assembly 100.

Figure 3:
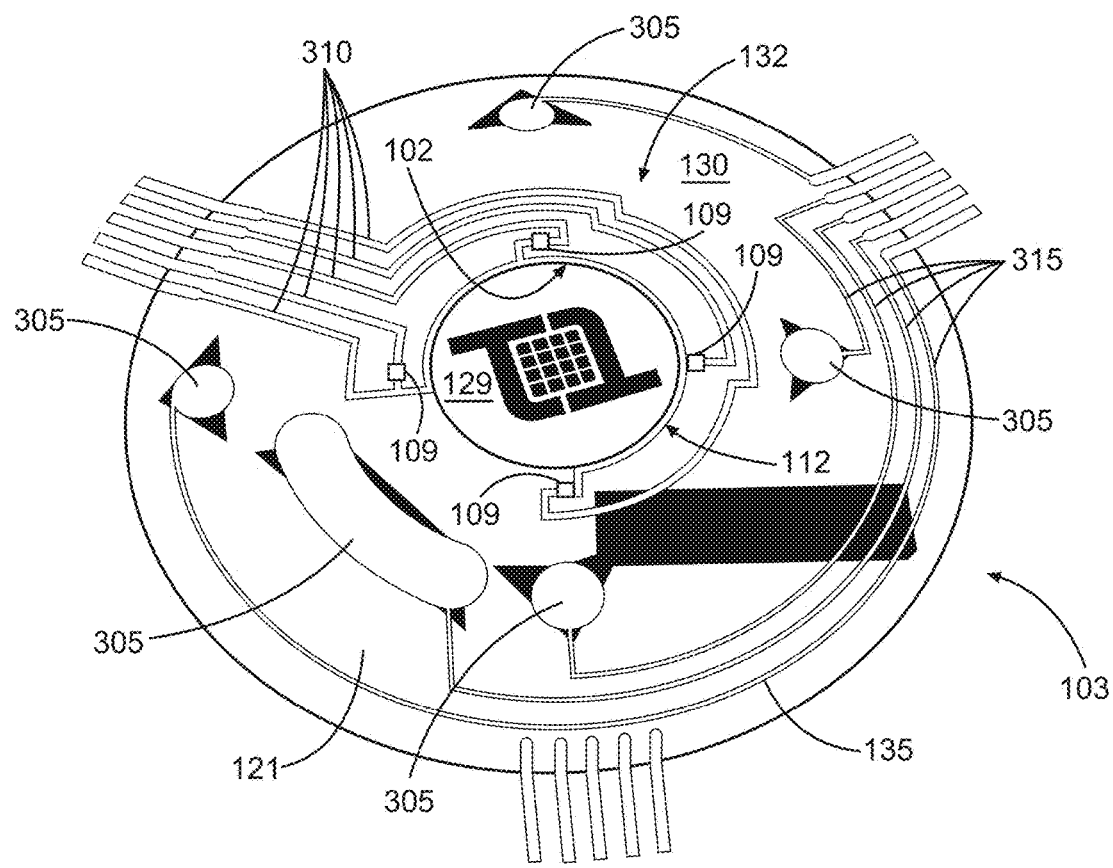
FIG. 3 is a three-dimensional rearview of a cover assembly forming part of the illuminated control panel of FIG. 1, in accordance with an example embodiment.

FIG. 3 shows an isolated view of the cover member 103 and the electronic components provided thereon from the inner side (i.e., showing the control panel assembly 100 without the optical matrix layer 106). It can be seen that the conductive traces 135 of the electronic circuitry 132 defines LED leads 310 for a group of four LEDs 109 spaced circumferentially at regular intervals around the circular periphery 212 of the indicator window 112. The conductive traces 135 likewise provide respective button leads 315 for each of the capacitive buttons 305. Each of the leads 310, 315 is connected to a corresponding electronic connector 320 configured for coupling to a corresponding connector forming part of controlling electronics housed by the body 139 (FIG. 1) of the device 200. Note that the LED leads 310 provide a four-channel control arrangement for the four peripheral LEDs 109 of the indicator window 112, so that activation of the peripheral LEDs 109 can be individually controlled.

Note that, in this example embodiment, each LED 109 forming part of the control panel assembly 109 is a peripheral lighting device for the single indicator window 112, because each of the LEDs 109 is located at the periphery 212 of the indicator window 112, and is configured to provide backlighting illumination for the indicator window 112. Each LED 109 is laterally offset from the periphery 212 of the indicator window 112, being obscured by the masking layer 121 when the control panel assembly 100 is viewed from the outside and in a direction substantially normal to the cover panel laminate at the indicator window 112. The LEDs 109, thus, in practice, hidden from view behind the masking layer 121 while being proximate to the periphery 212 of the indicator window 112, to provide backlighting for the indicator window 112 compare the optical medium provided by the optical matrix layer 106.

Figure 4:
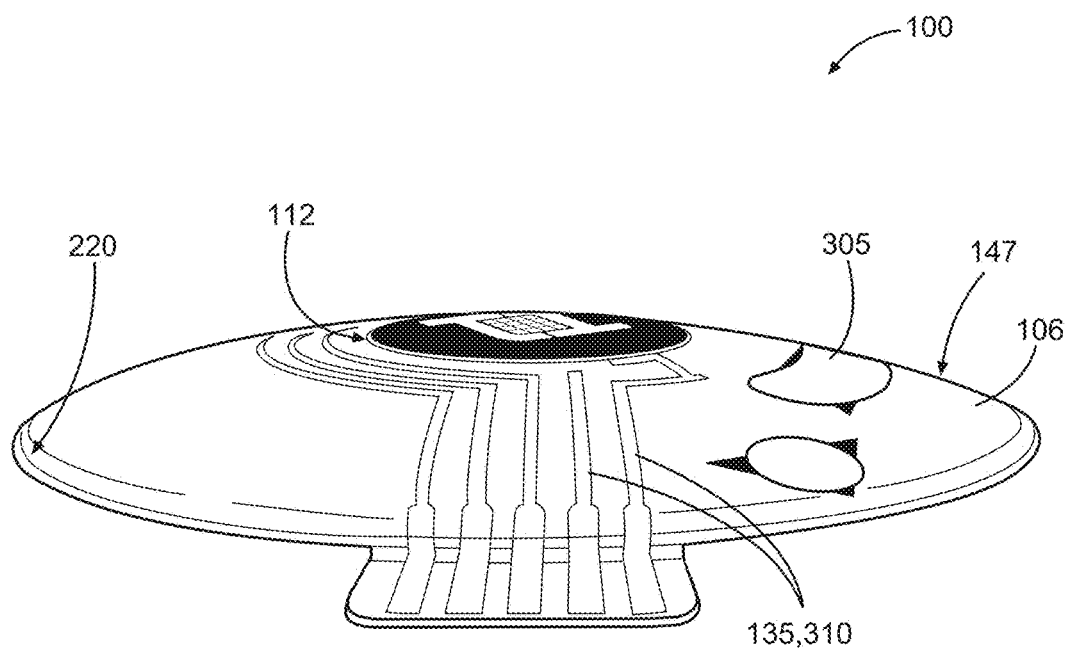
FIG. 4 is an oblique three-dimensional side view of the cover assembly of FIG. 3, in accordance with an example embodiment.

Referring now to FIG. 4, it can be seen that the composite laminate structure provided by the cover panel assembly 100 is contoured in shape (e.g., not being flat), in this example embodiment having a compound curvature, such that the outer face 118 is concavely curved. The cover member 103 (e.g., comprising the substrate foil 115 and the masking layer 121) has a substantially constant thickness, so that the inner surface 130 of the cover member has a compound curvature identical to that of the outer face 118. The optical matrix layer 106 may likewise have a constant thickness, in this example embodiment being less than 2 mm thick, and may have a curvature which is sympathetic or identical to that of the cover member 103. Note that the thickness of the components of the control panel assembly 100 is exaggerated in FIG. 1, for clarity of illustration. The overall thickness of the control panel assembly 100 may be less than 2 mm, in some embodiments being less than 1.5 mm.

Referring again to FIG. 1, it can be seen that the electronic components of the control panel assembly 100 (e.g., comprising the LEDs 109, the conductive traces 135, and the capacitive buttons 305) are embedded in the optical matrix layer 106. The optical matrix layer 106 is thus a molded component, having been overmolded on to the inner surface 130 of the cover member 103, after the LEDs 109 have been mounted on the conductive traces 135 printed on the inner surface 130 of the cover member 103. In this example embodiment, an inner surface 147 of the optical matrix layer 106 is separated from the body 139 of the device 200 by an air gap 149, when the control panel assembly 100 is incorporated in the device 200.

In use, control panel assembly 100 may be mounted on an electronic device 200 to indicate an operation status or mode of the electronic device 200, and/or to provide control functionality over the electronic device 200. In a particular embodiment, the device 200 may be computer peripheral to allow control over computer operation, but in other example embodiments, control panel assemblies similar or analogous to the described control panel assembly 100 may be provided in association with, e.g., electronic devices such as printers, electronic reading devices, mobile telephones, lighting controls for a residential or industrial facility, control and/or indicator components in an automobile or industrial equipment, and the like.

The peripheral LEDs 109 can in these cases be controlled by the associated device 200 to provide backlighting for the indicator window 112 responsive to control of the device 200 by a user, e.g. via the capacitive control buttons 305. Light emitted by the LEDs 109 is guided by the optical matrix layer 106 such that at least some of the emitted light escapes through the cover member 103 via the indicator window 112, passing through the optical element 129 and the transparent substrate foil 115 to make visible or emphasize the indicator window 112. Passage of light from the side-mounted peripheral LEDs 109 through the indicator window 112 may be promoted by reflection of light from the inner surface 147 of the optical matrix layer 106, and may in some instances be further promoted by optical diffusers provided, e.g., as part of the optical element 129 in the indicator window 112.

It will be appreciated that the intensity of illumination provided by a particular LED 109 decreases progressively with an increase in distance from the LED 109, such that each peripheral LEDs 109 has a limited effective backlighting range. In devices with multiple indicator structures (see for example FIG. 5), this construction allows separate backlighting of separate indicator structures by means of separate peripheral LEDs 109 (or separate sets of peripheral LEDs 109). In this example embodiment, however, the device 200 includes a single indicator structure in the form of the indicator window 112, but provision of multiple peripheral LEDs 109 permits provision of dynamic or animated backlighting effects in the indicator window 112. The four peripheral LEDs 109 of the indicator window 112 may, for example, be controlled to provide different modes of backlight illumination for the indicator window 112, corresponding to different modes of operation of the device 200. In this example, the modes of animated illumination can include:
(a) continuous synchronous illumination by all four peripheral LEDs 109;
(b) synchronous pulsing illumination;
(c) wavelike transition of illumination from one side to the other, or top to bottom/bottom to top; and
(d) a circulating illumination effect by sequential activation and deactivation of the LEDs 109 circumferentially around the indicator window 112.

In some embodiments, a backlighting arrangement for a particular indicator structure can be multicolored, in which case one or more indicating modes of the associated indicator structure may include color-coded static indicator modes and/or multicolor animated/dynamic indicator modes. The static indicator modes may comprise changing the backlighting color of the indicator window 112 to indicate a corresponding mode of operation of the electronic device 200. A malfunction mode of the electronic device 200 may, for example, be indicated by backlighting the indicator window 112 with red illumination. Dynamic or animated multicolor indicator modes can comprise, on the one hand, monochromatic color-coded performance of the above-listed modes of animated illumination (e.g., pulsing in red, circulating in blue, etc.), or may comprise, on the other hand, dynamically varying in backlighting color in combination of performance of the above-listed animated illumination modes. Note that a single device can be configured to perform all of the above-mentioned indicator modes, depending on the current mode of operation of the electronic device 200

Multicolor backlighting may be achieved by having multiple monochromatic peripheral LEDs mounted on the periphery of a single indicator structure, and including at least two sets of differently colored monochromatic LEDs. Thus, for example, the indicator window 112 may comprise a set of red LEDs, a set of blue LEDs, and a set of green LEDs, regularly spaced around the periphery 212 of the indicator window 112. Color variation may then be achieved by automated control of the respective sets of colored peripheral LEDs, to vary contribution of the respective monochromatic sets to the resultant backlighting of the indicator window 112. It will be appreciated that backlighting illumination in many different colors can be achieved by changing the intensity of the respective sets of colored peripheral LEDs. Instead, or in addition, the peripheral LEDs 109 may comprise individual multicolor LEDs (also known as multicolor white LEDs or RGB LEDs), in which case the provision of multicolor backlighting (whether static or animated/dynamic) may be achieved by controlling resultant color emitted by the respective peripheral multicolor LEDs.

Figure 5:
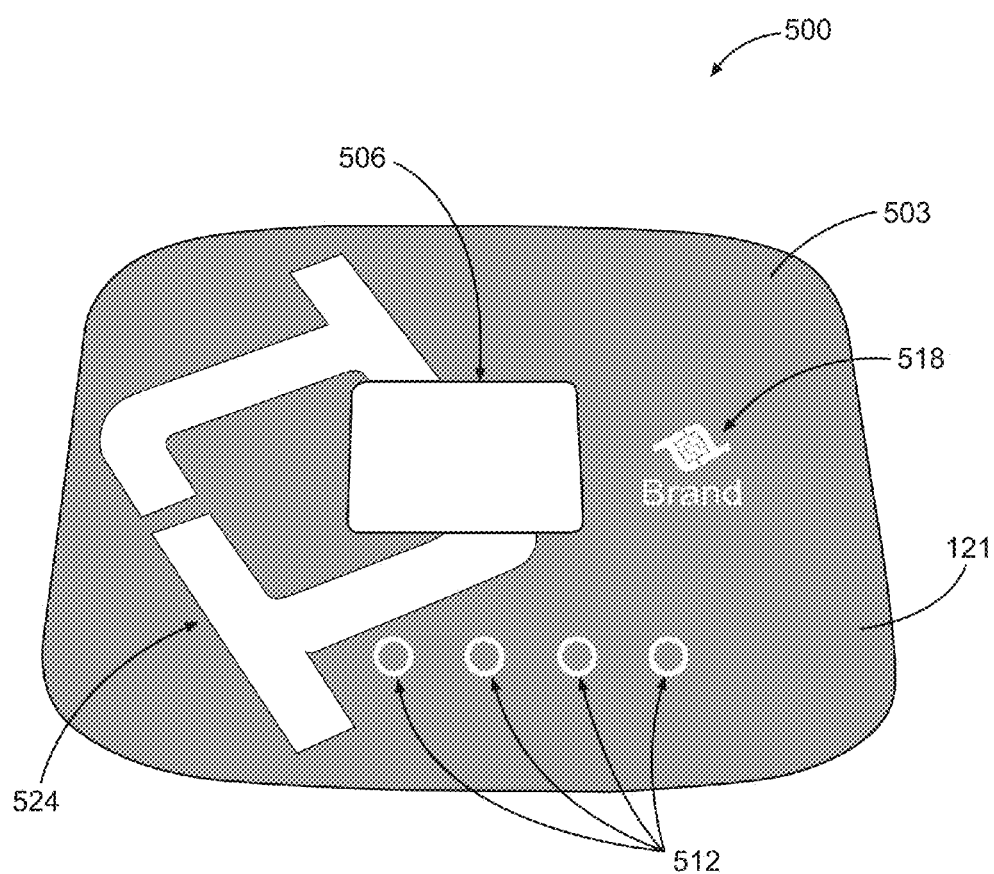
FIG. 5 is a front view of an electronic device in accordance with another example embodiment.

FIG. 5 shows an example embodiment of a device 500 in accordance with another example embodiment. Identical reference numerals are used for analogous or corresponding elements in the embodiment of FIGS. 1-4 and in the embodiment of FIGS. 5-7, unless otherwise indicated.

As shown in FIG. 5, the device 500 has multiple indicator structures configured for backlighting by integral, overmolded lighting devices forming part of a laminate cover assembly 503. The example device 500 has a power indicator 518 whose elimination status is indicative of a power status of the device 500. In this example, the power indicator 518 comprises a manufacturer trademark logo and brand name for the device 500. The device 500 further has a series of four button indicators 512 configured for indicating a selection status of the associated, integrally formed, capacitive buttons 305 (see FIG. 6) positioned coincident with the respective button indicators 512. In this example, each button indicator 512 comprises an annular opening in a masking layer 121 of the cover assembly 503 (see FIG. 7). Each annular opening providing the respective button indicator 512 extends peripherally around a corresponding one of the capacitive buttons 305. The example device 500 further has a central rectangular opening that provides a display window 506 for a liquid crystal display (LCD) forming part of the device 500.

Figure 6:
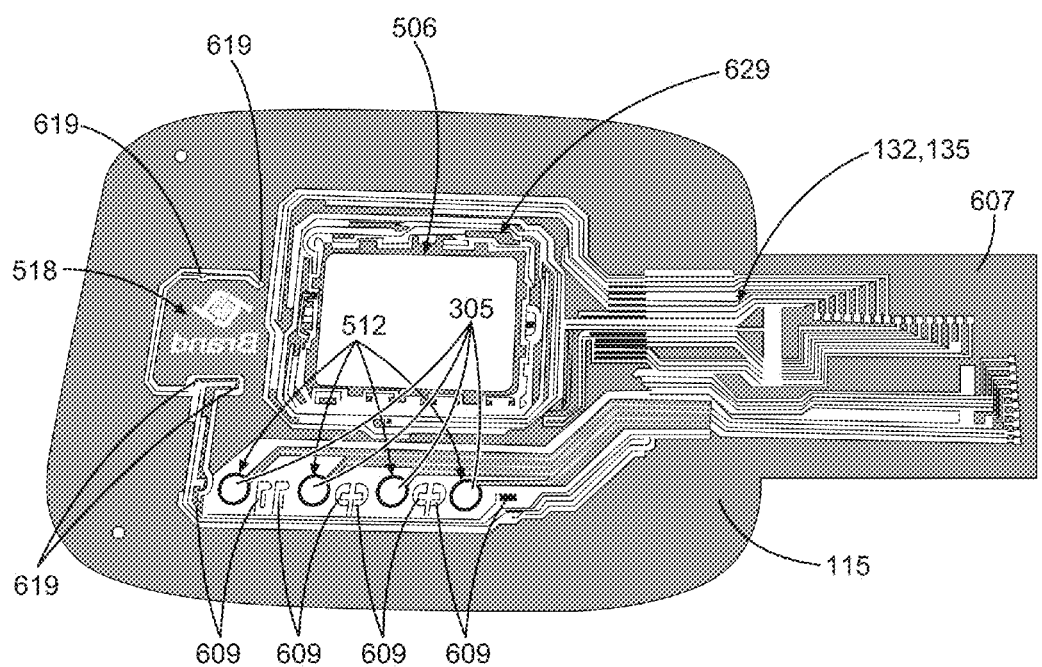
FIG. 6 is a schematic rear view of a cover assembly forming part of an illuminated control panel of the example electronic device of FIG. 5, in accordance with the further example embodiment.

Referring now to FIG. 6, which shows an inner side of the cover assembly 503 in a preassembled condition prior to the provision of the optical matrix layer 106 and incorporation of the cover assembly in the device 500, it can be seen that two LEDs 609 are provided at the periphery of each button indicator 512. Each button indicator 512 is thus flanked by a pair of button LEDs 609 that are respectively positioned adjacent a periphery of the associated annular button indicator 512. Backlighting of a particular one of the button indicators 512 can thus be achieved by activating the associated pair of peripheral button LEDs 609. Because of the limited backlighting range of each laterally offset LED 609, however, the backlighting arrangement for each button indicator 512 is optically segregated from that of the other button indicator 512, so that the respective button LEDs 609 are dedicated to the corresponding indicator structure. The power indicator 518 similarly has a set of four dedicated LEDs 619 arranged adjacent the periphery of the power indicator 518.

Note that no backlighting illumination is provided for the display window 506 in this example. Instead, the electronic circuitry 132 provided by conductive traces 135 on the inner surface 124 of the cover assembly 503 provide a touch detection grid 629 comprising infrared LEDs and photodiodes. Note also that a part of the electronic circuitry 132 shown in FIG. 6 is provided on a foldout contact leaf 607 that is folded onto a main portion of the cover assembly 503 during assembly and incorporation thereof in the device 500.

Turning now to FIG. 7, it is shown that the laminate structure of the cover assembly 503 differs in some respects to the control panel assembly 100 of FIG. 1. In the example embodiment of FIG. 7, the masking layer 121 and an optical element 129 is attached to the outer face 118 of the transparent substrate foil 115, so that an outer surface of the masking layer 121 provides an outer face of the cover assembly 503 and the device 500. In the example embodiment of FIG. 7, the optical element 129 is a diffuser to diffuse the light passing through the associated indicator 512/518.

The body 139 of the device 500 is furthermore in direct contact with the inner surface 147 of the optical matrix layer 106, without an air gap between them. To limit internal reflection of light emitted by the embedded LEDs 609, 619 a nonreflective surface 707 is provided in contact with the inner major face 147 of the optical matrix layer 106. In this example embodiment, the nonreflective surface 707 comprises a black surface. The provision of the nonreflective surface 707 serves further to limit the effective backlighting range of each LED 609, 619. An optical effect area, in this example comprising a reflective area 714, is, however, provided beneath or in register with each indicator structure (e.g., beneath each button indicator 512 and beneath the power indicator 518). The reflective area 714 promotes limited range reflection of light onto and through the corresponding opening in the masking layer 121 of the corresponding indicator structure 512, 518.

It is a benefit of the control panel assembly or indicator panel assembly as described with reference to the example embodiments that significant space saving is achieved when compared to existing integrally backlit control/indicator panel assemblies. Backlighting LEDs are, for example, often positioned underneath a cover structure assembly, in which case vertical offset for the LEDs is required.

Another benefit is that, because the LEDs are positioned in the cover/indicator structure instead of in a main board of the electronic device, more space may be available in the device for other functionalities. An integrally illuminated laminate provided by the disclosed assembly can also be used as a separate thin indicator structure or cover structure separate from a device control unit, for example as part of an automotive dash, dashboard, or handle.

A further benefit is that no separate lightguides are needed for respective LEDs. Instead, the optical matrix layer 106 serves as a common light guide for multiple peripheral LEDs 109 of a common indicator structure, and may serve as a common light guide for multiple indicator structures. Separate light guides would, in particular, be necessary with prior cover assembly constructions in order to provide animated or dynamic indicator modes, as described. Such a reduction in the number of components of a cover assembly (which, as described, may form an indicator assembly or a control panel assembly for an electronic device) may beneficially result in reduced costs due to a reduction in the necessary bill of materials, and all resulting from fewer manufacturing steps.

Figure 2:
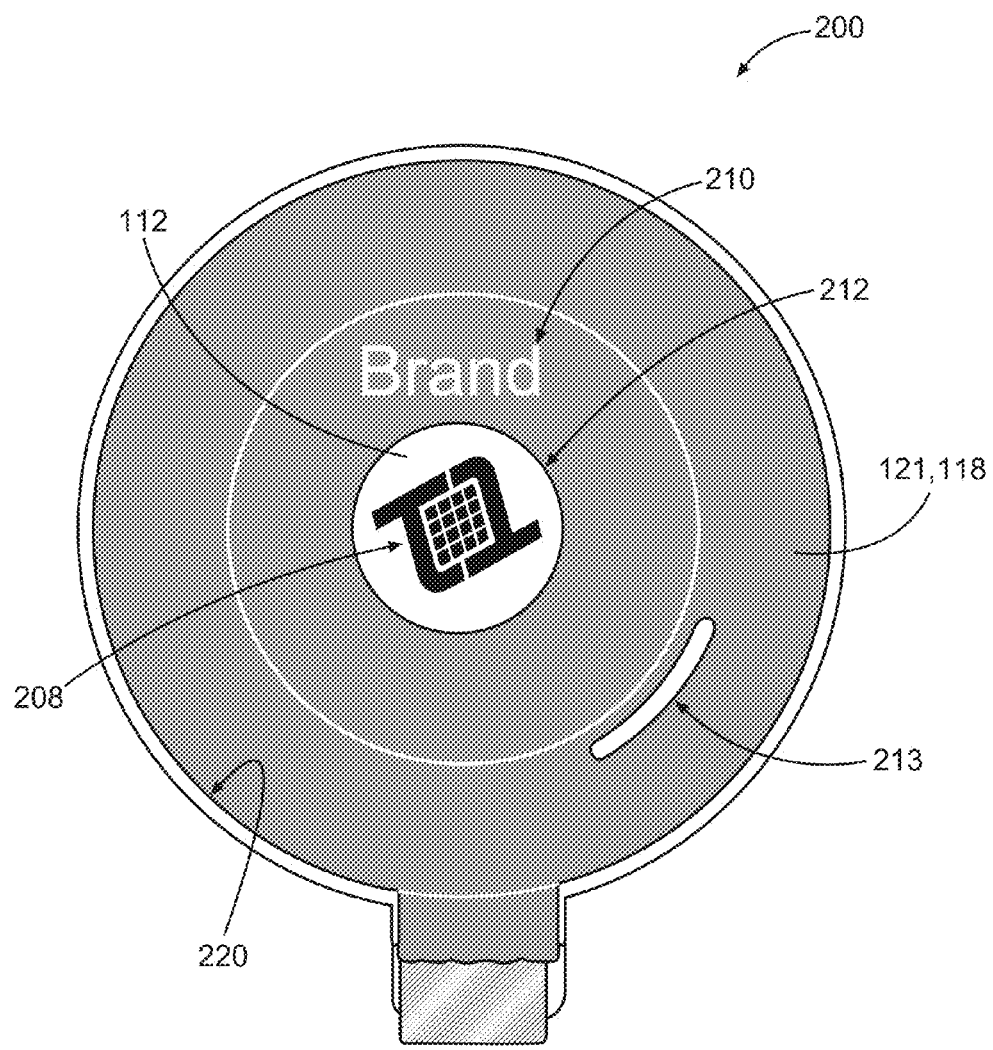
FIG. 2 is a schematic front view of an example electronic device in accordance with an example embodiment, the electronic device having an illuminated control panel such as that of FIG. 1.

While the relatively limited effective range for backlighting illumination of each LED 109 allows for backlighting segregation of different indicator structures that are configured for backlighting illumination (e.g., the respective button indicators 512 in FIG. 6) the optical matrix layer 106 can the same time serve to guide light over a more extended range to provide edge illumination effects (e.g., illuminating the peripheral ring 220 by light escaping from the circular peripheral edge of the optical matrix layer 106, in the example embodiment of FIG. 2). Such extended like guiding functionality can be provided in any substances where the cover assembly laminate has a surface shape or topography that is contoured or complex. Limitation of the backlighting illumination range of each peripheral LEDs may be promoted by the provision of nonreflective surfaces in contact with the opposite major faces of the optical matrix layer 106, e.g., the black masking layer 121 and the black nonreflective body surface 707 which sandwich the optical matrix layer 106 in the example embodiment of FIG. 7.

Yet a further benefit of the disclosed assembly is that the assembly is more robust than is the case with comparable existing power structures, due to watertight and hermetically sealed encapsulation of the electronic components of the assembly in the molded, polymeric optical matrix layer 106.

Although embodiments have been described with reference to specific example embodiments, it will be evident that various modifications and changes may be made to these embodiments without departing from the broader spirit and scope of the disclosure. Accordingly, the specification and drawings are to be regarded in an illustrative rather than a restrictive sense.

The Abstract is provided to allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A cover assembly for an electronic device, the cover assembly comprising:
a substantially opaque cover having a pair of oppositely directed major faces respectively defining an outer face and an inner face, the cover defining an optical indicator opening via which backlighting illumination is passable through the cover;

a matrix layer on the inner face of the cover, the matrix layer overlapping the optical indicator opening and being of an optically conductive material; and a backlighting arrangement comprising one or more lighting devices embedded in the matrix layer to provide backlighting illumination to the optical indicator opening via the matrix layer, the one or more lighting devices being offset from the optical indicator opening such that none of the one or more lighting devices is located in a line of sight through the optical indicator opening, when viewed in a direction transverse to the outer face of the cover member at the optical indicator opening.

2. The cover assembly of claim 1, further comprising electronic circuitry embedded in the matrix layer and electronically coupled to the one or more lighting devices.

3. The cover assembly of claim 2, further comprising one or more capacitive buttons located on the inner face of the cover, the one or more capacitive buttons being embedded in the matrix layer and being coupled to the electronic circuitry.

4. The cover assembly of claim 2, wherein the electronic circuitry comprises printed circuitry deposited on the inner face of the cover.

5. The cover assembly of claim 4, wherein the one or more lighting devices are mounted on the inner face of the cover member.

6. The cover assembly of claim 1, wherein the cover is a composite laminate structure comprising:
a translucent substrate, and
a substantially opaque masking layer carried by the translucent substrate, the optical indicator opening being defined by a corresponding cutout in the masking layer and being covered by the translucent substrate.

7. The cover assembly of claim 6, wherein the masking layer comprises printed material deposited on an inner face of the translucent substrate.

8. The cover assembly of claim 1, wherein the matrix layer is of a substantially transparent molded plastics material.

9. The cover assembly of claim 1, wherein the one or more lighting devices comprise a plurality of light emitting diodes (LEDs).

10. The cover assembly of claim 1, further comprising a nonreflective surface at a major face of the optical matrix layer furthest from the cover member, so that the optical matrix layer is sandwiched between the cover member and the nonreflective surface.

11. The cover assembly of claim 10, wherein the nonreflective surface is interrupted by an optical effect area substantially aligned with the optical indicator opening in a direction substantially normal to the outer face of the cover member at the optical indicator opening.

12. The cover assembly of claim 1, wherein the cover has a substantially constant thickness and has a contoured shape, so that the inner and outer faces of the cover are similarly contoured.

13. The cover assembly of claim 12, wherein the matrix layer is substantially constant in thickness, having a sympathetically contoured shape corresponding to that of the cover.

14. The cover assembly of claim 1, wherein the backlighting arrangement comprises a plurality of associated lighting devices, each of the plurality of lighting devices being located adjacent a periphery of the optical indicator opening.

15. The cover assembly of claim 14, wherein the cover defines a plurality of optical indicator openings, each of which has an associated plurality of lighting devices located in the matrix layer to provide backlighting for the respective optical indicator opening.

16. An electronic device comprising a body and an indicator panel assembly mounted on the body, the indicator panel assembly comprising:
a substantially opaque cover having a pair of oppositely directed major faces respectively defining an outer face and an inner face, the cover defining an optical indicator opening via which backlighting illumination is passable through the cover;
a matrix layer on the inner face of the cover, the matrix layer overlapping the optical indicator opening and being of an optically conductive material; and
a backlighting arrangement comprising one or more lighting devices embedded in the matrix layer to provide backlighting illumination to the optical indicator opening via the matrix layer, the one or more lighting devices being offset from the optical indicator opening such that none of the one or more lighting devices is located in a line of sight through the optical indicator opening, when viewed in a direction transverse to the outer face of the cover member at the optical indicator opening.

17. The electronic device of claim 16, further comprising electronic circuitry embedded in the matrix layer and electronically coupled to the one or more lighting devices.

18. The electronic device of claim 17, wherein the electronic circuitry comprises printed circuitry deposited on the inner face of the cover.

19. The electronic device of claim 18, wherein the backlighting arrangement comprises a plurality of lighting devices mounted on the inner face of the cover.

20. The electronic device of claim 16, wherein the cover is a composite laminate structure comprising:
a translucent substrate, and
a substantially opaque masking layer carried by the translucent substrate, the optical indicator opening being defined by a corresponding cutout in the masking layer and being covered by the translucent substrate.

* * * * *